US007616196B2

(12) United States Patent
Lee

(10) Patent No.: US 7,616,196 B2
(45) Date of Patent: Nov. 10, 2009

(54) PLASMA DISPLAY DEVICE AND DRIVING METHOD THEREOF

(75) Inventor: Joo-Yul Lee, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 164 days.

(21) Appl. No.: 11/966,789

(22) Filed: Dec. 28, 2007

(65) Prior Publication Data

US 2008/0165089 A1 Jul. 10, 2008

(30) Foreign Application Priority Data

Jan. 4, 2007 (KR) ..................... 10-2007-0000969

(51) Int. Cl.
*G03F 3/038* (2006.01)

(52) U.S. Cl. ...................................................... 345/204

(58) Field of Classification Search ............. 345/60–72, 345/211; 315/169.2, 169.4; 313/581–587
See application file for complete search history.

(56) References Cited

U.S. PATENT DOCUMENTS

2005/0099365 A1* 5/2005 Lee ............................ 345/63
2005/0168406 A1* 8/2005 Lee et al. ...................... 345/60

FOREIGN PATENT DOCUMENTS

KR 10-2004-0071491 8/2004
KR 10-2005-0113877 12/2005
KR 10-2006-0121020 11/2006
KR 10-0645789 11/2006

OTHER PUBLICATIONS

Korean Patent Abstracts, Publication No. 1020040071491 A, dated Aug. 12, 2004, in the name of Gwang Ho Jin et al.
Korean Patent Abstracts, Publication No. 1020060121020 A, dated Nov. 11, 2006, in the name of Won Jae Kim et al.
Korean Patent Abstracts, Publication No. 1020050113877 A, Published on Dec. 5, 2005, in the name of Yang et al.
Korean Patent Abstracts, Publication No. 100645789 B1, Published on Nov. 7, 2006, in the name of Shim et al.

* cited by examiner

*Primary Examiner*—Richard Hjerpe
*Assistant Examiner*—Shaheda A Abdin
(74) *Attorney, Agent, or Firm*—Christie, Parker & Hale, LLP

(57) ABSTRACT

During a sustain period of a plasma display device, voltages of Vs and 0V are alternately applied to a plurality of scan electrodes. At this time, by applying Vs to a first node, a first capacitor with a first terminal coupled to the first node is charged with a first voltage. By then applying 0V to the first node, a second capacitor with a first terminal is coupled to a second node with a voltage of a second terminal of the first capacitor is charged with a second voltage. In an address period, a voltage of the second node is selectively applied to a plurality of scan electrodes. Therefore, an additional power source for supplying a voltage to selectively apply to a plurality of scan electrodes in an address period is not necessary.

16 Claims, 9 Drawing Sheets

PLASMA DISPLAY DEVICE AND DRIVING METHOD THEREOF

CROSS-REFERENCE TO RELATED APPLICATION

This application claims priority to and the benefit of Korean Patent Application No. 10-2007-0000969 filed in the Korean Intellectual Property Office on Jan. 4, 2007, the entire content of which is incorporated herein by reference.

BACKGROUND OF THE INVENTION

1. Field of the Invention

The present invention relates to a plasma display device and a driving method thereof.

2. Description of the Related Art

A plasma display device is a display device that uses a plasma display panel (PDP) that displays a character or an image using plasma generated by a gas discharge. A plurality of discharge cells is arranged in a matrix format in the PDP.

In general, in a plasma display device, one frame is divided into a plurality of subfields, and a grayscale is displayed by a combination of subfields of different weight values. During an address period of each subfield, light emitting cells and non-light emitting cells are selected by creating an address discharge, but the image is actually displayed by sustain discharges that are performed in the light emitting cells during a sustain period.

Such discharges are generated when a voltage difference between two electrodes is greater than some voltage, e.g., a predetermined voltage. A voltage difference between the two electrodes may be set to be more than that voltage by applying only positive voltages to the two electrodes, but because the required discharge voltage is so high, recently, the discharge voltage has been lowered by using a negative voltage. However, because a voltage level applied to each electrode is different in an address period and a sustain period, there is a problem in that the number of power sources increases.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention is directed to a plasma display device and a driving method thereof with a reduced number of power sources.

According to an exemplary embodiment of the present invention, a plasma display device including a plurality of scan electrodes has a first transistor coupled between a first power source for supplying a first voltage and a first node. A second transistor is coupled between a second power source for supplying a second voltage lower than the first voltage and the first node. A plurality of scan circuits are coupled to the corresponding plurality of scan electrodes, and selectively apply a voltage of a first input terminal and a second input terminal to a corresponding scan electrode. A first terminal of a first capacitor is coupled to the first node, and a first diode is coupled between a second terminal of the first capacitor and the second power source. The first diode forms a path for charging the first capacitor when the first transistor is turned on. A third transistor is coupled between a second input terminal of the plurality of scan circuits and the second terminal of the first capacitor.

According to another embodiment of the present invention, a method of driving a plasma display device with a plurality of scan electrodes includes charging a first capacitor that has a first terminal coupled to a first node with a second voltage by applying a first voltage to the first node. A second capacitor whose first terminal is coupled to a second node is charged with a voltage of a second terminal of the first capacitor with a fourth voltage by applying a third voltage to the first node. A voltage of the second node is selectively applied to the plurality of scan electrodes in an address period.

According to yet another embodiment of the present invention, a method of driving a plasma display device with a plurality of scan electrodes includes charging a first capacitor that has a first terminal coupled to a first node with a second voltage by applying a first voltage to the first node. A voltage of a second terminal of the first capacitor is selectively applied to the plurality of scan electrodes by applying a third voltage to the first node during an address period.

BRIEF DESCRIPTION OF THE DRAWINGS

The accompanying drawings, together with the specification, illustrate exemplary embodiments of the present invention, and, together with the description, serve to explain the principles of the invention.

DETAILED DESCRIPTION OF THE EMBODIMENTS

Figure 1:
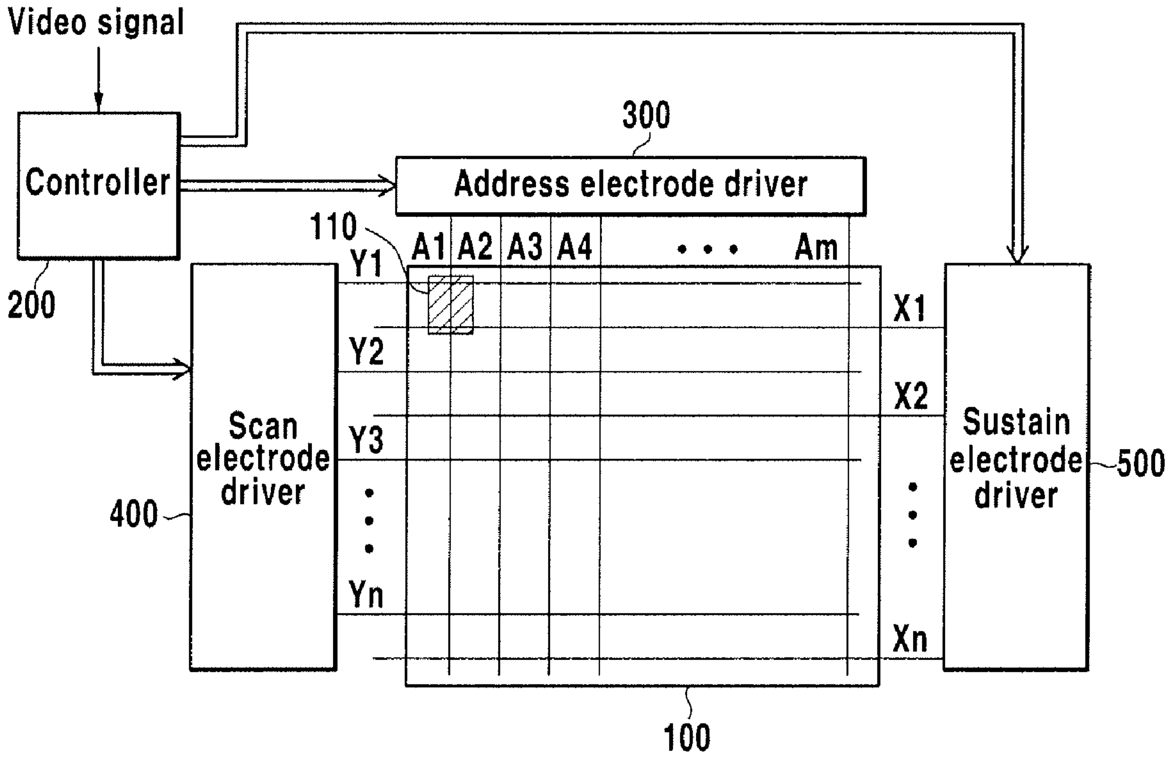
FIG. 1 is a block diagram illustrating a plasma display device according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. When it is described that an element is coupled or connected to another element, the element may be directly coupled or connected to the other element or coupled or connected to the other element through a third element.

Now, a plasma display device according to an exemplary embodiment of the present invention is described in detail.

FIG. 1 is a diagram illustrating a plasma display device according to an exemplary embodiment of the present invention.

As shown in FIG. 1, the plasma display device according to an exemplary embodiment of the present invention includes a PDP 100, a controller 200, an address electrode driver 300, a scan electrode driver 400, and a sustain electrode driver 500.

The PDP 100 includes a plurality of address electrodes (hereinafter referred to as "A electrodes") A1-Am that extend in a column direction, and a plurality of sustain electrodes (hereinafter referred to as "X electrodes") X1-Xn and a plurality of scan electrodes (hereinafter referred to as "Y electrodes") Y1-Yn that extend, while forming pairs, in a row direction. In general, the X electrodes X1-Xn are formed to correspond to the Y electrodes Y1-Yn, respectively, and the X electrodes X1-Xn and the Y electrodes Y1-Yn perform a display operation for displaying an image during a sustain period. The Y electrodes Y1-Yn and the X electrodes X1-Xn are disposed to cross the A electrodes A1-Am. A discharge space at a crossing region of the A electrodes A1-Am and the X and Y electrodes X1-Xn and Y1-Yn forms a discharge cell (hereinafter referred to as a "cell") 110. This structure of the PDP 100 is one example, and a panel having other structures for applying driving waveforms, to be described later, can also be applied to the present invention.

The controller 200 receives a video signal from the outside to output an A electrode driving control signal, an X electrode driving control signal, and an Y electrode driving control signal. The controller 200 divides one frame into a plurality of subfields that are driven using the driving control signals. Each subfield includes a reset period, an address period, and a sustain period in sequence.

The address electrode driver 300 receives the A electrode driving control signal from the controller 200 to apply a display data signal for selecting a cell to display to each A electrode.

The scan electrode driver 400 receives the Y electrode driving control signal from the controller 200 to apply a driving voltage to the Y electrodes.

The sustain electrode driver 500 receives the X electrode driving control signal from the controller 200 to apply a driving voltage to the X electrodes.

Figure 2:
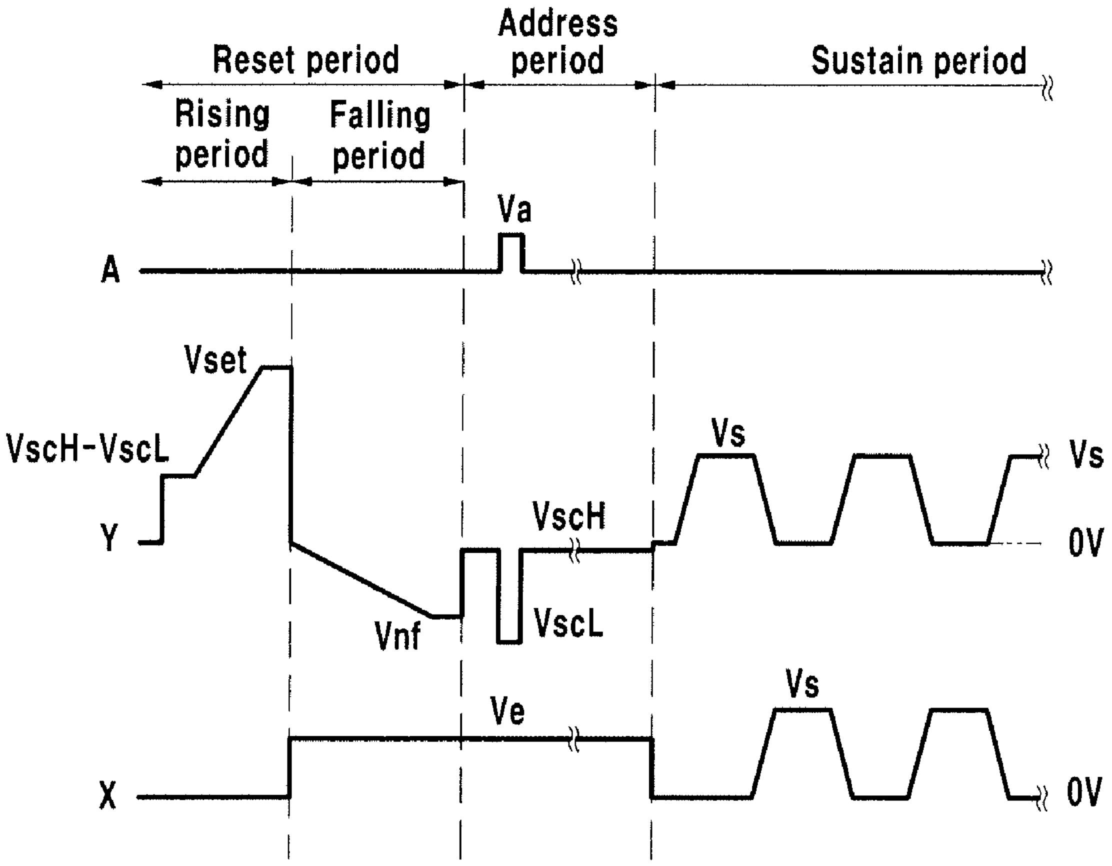
FIG. 2 is a timing diagram illustrating driving waveforms of a plasma display device according to an exemplary embodiment of the present invention.

FIG. 2 is a timing diagram illustrating driving waveforms of a plasma display device according to an exemplary embodiment of the present invention. For better understanding and ease of description, FIG. 2 shows only a driving waveform of one subfield of a plurality of subfields constituting one frame and shows only a driving waveform that is applied to one X electrode, one Y electrode, and one A electrode for forming one cell.

As shown in FIG. 2, during a rising period of a reset period, the address electrode driver 300 and the sustain electrode driver 500 bias the A electrode and the X electrode with a reference voltage (0V in FIG. 2), and the scan electrode driver 400 gradually increases a voltage of the Y electrode from a voltage (VscH-VscL) to a voltage of Vset. FIG. 2 shows that the voltage of the Y electrode increases in a ramp pattern. As a feeble discharge (hereinafter, referred to a "weak discharge") occurs between the Y electrode and the X electrode and between the Y electrode and the A electrode while the voltage of the Y electrode increases, negative (−) wall charges are formed on the Y electrode and positive (+) wall charges are formed on the X and A electrodes.

In a falling period of the reset period, the sustain electrode driver 500 biases the X electrode to a voltage Ve, and the scan electrode driver 400 gradually decreases the voltage of the Y electrode from 0V to a voltage of Vnf. As a weak discharge occurs between the Y electrode and the X electrode and between the Y electrode and the A electrode while the voltage of the Y electrode decreases, negative (−) wall charges that were formed on the Y electrode and positive (+) wall charges that were formed on the X and A electrodes are erased. In general, the magnitude of the voltage (Vnf-Ve) is set to be around a discharge firing voltage between the Y electrode and the X electrode. Accordingly, a wall voltage between the Y electrode and the X electrode becomes almost 0V, whereby a cell in which an address discharge does not occur during an address period can be prevented from misfiring during a sustain period.

During an address period, in order to select a light emitting cell, the scan electrode driver 400 and the address electrode driver 300 apply a scan pulse having the voltage VscL and an address pulse having the voltage Va to the Y electrode and the A electrode, respectively. Accordingly, an address discharge occurs in a cell to which the scan pulse and the address pulse are applied. Positive (+) wall charges are formed on the Y electrode and negative (−) wall charges are formed on the A electrode and the X electrode, whereby the cell is set to be a light emitting cell. Further, the scan electrode driver 400 biases an unselected Y electrode with a voltage VscH, which is higher than the voltage VscL, and the address electrode driver 300 biases an A electrode of a non-light emitting cell with a ground voltage. In FIG. 2, the voltage VscH and the voltage VscL are assumed to be negative voltages.

Specifically, the scan electrode driver 400 and the address electrode driver 300 apply a scan pulse to the Y electrode (e.g., Y1 of FIG. 1) in a first row and simultaneously apply an address pulse to the A electrode in which a light emitting cell is positioned in the first row. Accordingly, an address discharge occurs between the Y electrode in the first row and the A electrode to which an address pulse is applied, whereby positive (+) wall charges are formed on the Y electrode and negative (−) wall charges are formed on the A and X electrodes. Next, the scan electrode driver 400 and the address electrode driver 300 apply an address pulse to the A electrode that is positioned in a light emitting cell in a second row while applying a scan pulse to the Y electrode (e.g., Y2 of FIG. 1) in the second row. Accordingly, an address discharge occurs in a cell that is formed by the A electrode to which an address pulse is applied and the Y electrode in the second row, whereby a wall charge is formed in the cell. Similarly, the scan electrode driver 400 and the address electrode driver 300 form wall charges by applying an address pulse to the A electrode that is positioned in the light emitting cell while sequentially applying scan pulses to the Y electrodes in the remaining rows.

Because the wall voltage of the Y electrode is set to be higher than the X electrode in a cell, i.e., a light emitting cell in which an address discharge occurs in an address period, the scan electrode driver 400 and the sustain electrode driver 500 apply a sustain discharge pulse having the voltage Vs to the Y electrode in a sustain period and apply a ground voltage to the X electrode, whereby a sustain discharge occurs between the Y electrode and the X electrode. As a result of the sustain discharge, as negative (−) wall charges are formed on the Y electrode and positive (+) wall charges are formed on the X electrode, the wall voltage of the Y electrode is higher than the X electrode.

Next, as the scan electrode driver 400 and the sustain electrode driver 500 apply a ground voltage to the Y electrode and apply a sustain discharge pulse having the voltage Vs to the X electrode, a sustain discharge occurs between the Y electrode and the X electrode. As a result, as positive (+) wall charges are formed on the Y electrode and negative (−) wall charges are formed in the X electrode, when a sustain discharge pulse having a voltage Vs to the Y electrode is applied, a sustain discharge can be generated. Thereafter, as a process of applying a sustain discharge pulse having a voltage Vs to the Y electrode and a process of applying a sustain discharge pulse having a voltage Vs to the X electrode are repeated by the number of times corresponding to a weight value in which the corresponding subfield displays, an image is displayed.

In FIG. 2, sustain discharge pulses having voltages Vs are alternately applied to the Y electrode and the X electrode, but a sustain discharge pulse may be applied to the Y electrode and/or the X electrode so that a voltage difference between the Y electrode and the X electrode is alternately voltages Vs and −Vs. For example, in a state where the X electrode is biased with a ground voltage, a sustain discharge pulse alternately having voltages Vs and −Vs may be applied to the Y electrode.

Further, in FIG. 2, after a cell is initialized to be a non-light emitting cell by erasing the wall charge of the cell in the reset period, the cell is set to be a light emitting cell through an address discharge in an address period. In other embodiments, after the cell is set to be a light emitting cell by writing a wall charge in the cell in a reset period, or after a sustain period of a previous subfield, the cell may be set to be a non-light emitting cell through an address discharge in an address period.

Next, a scan electrode driving circuit that can generate a driving waveform that is applied to the Y electrode among driving waveforms of the plasma display device that is shown in FIG. 2 will be described in detail with reference to FIG. 3.

Figure 3:
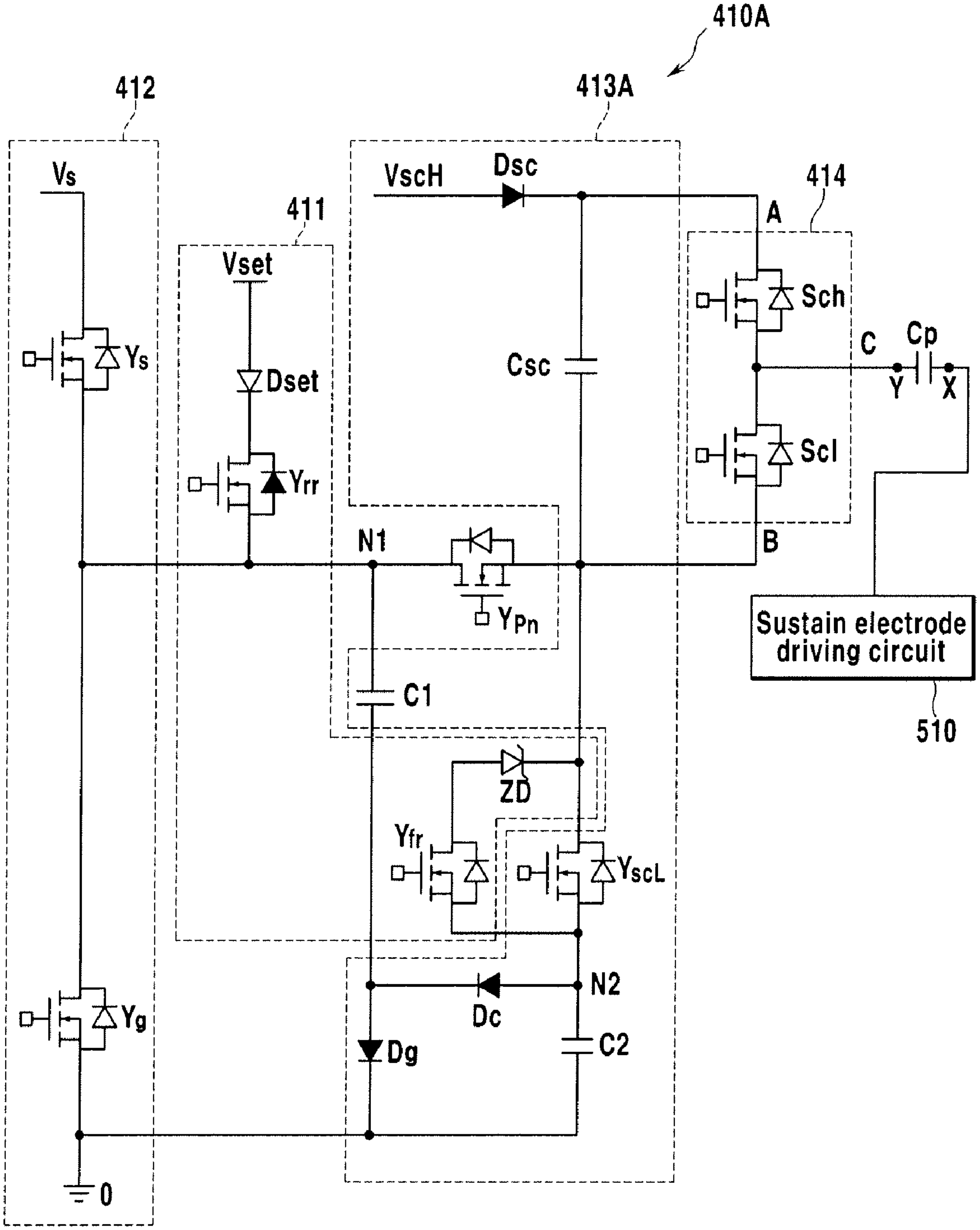
FIG. 3 is a diagram schematically illustrating a scan electrode driving circuit according to a first exemplary embodiment of the present invention.

FIG. 3 is a diagram schematically illustrating a scan electrode driving circuit according to an exemplary embodiment of the present invention. In FIG. 3, the scan electrode driving circuit 410A can be formed in the scan electrode driver 400, and the sustain electrode driving circuit 510 coupled to an X electrode may be formed in the sustain electrode driver 500. For better understanding and ease of description, only one Y electrode is shown, and a capacitive component that is formed by the Y electrode and the X electrode is described as a panel capacitor Cp.

As shown in FIG. 3, the scan electrode driving circuit 410A includes a reset driver 411, a sustain driver 412, a scan driver 413A, a scan circuit 414, and a transistor Ypn. The sustain driver 412 includes transistors (Ys, Yg), and the reset driver 411 includes a diode Dset, transistors (Yrr, Yfr), and a zener diode ZD. The scan driver 413A includes a transistor YscL, capacitors (C1, C2, Csc), and diodes (Dsc, Dg, Dc).

The scan circuit 414 has a first input terminal A and a second input terminal B, and an output terminal C thereof is coupled to the Y electrode. The scan circuit 414 is selectively applies a voltage of the first input terminal A or a voltage of the second input terminal B to the corresponding Y electrode in order to select a light emitting cell during an address period. In FIG. 3, only one scan circuit 414 that is coupled to the Y electrode is shown, but a respective scan circuit 414 is coupled to each of the plurality of Y electrodes Y1-Yn. In one embodiment, multiple scan circuits 414 corresponding to the Y electrodes Y1-Yn are formed in one scan integrated circuit (IC), and thus a plurality of output terminals of the scan integrated circuit may be coupled to the Y electrodes.

The scan circuit 414 includes transistors (Sch, Scl). A source of the transistor Sch and a drain of the transistor Scl is coupled to the Y electrode of the panel capacitor Cp. An anode of the diode Dsc is coupled to a power source VscH for supplying the VscH voltage, and a cathode of the diode Dsc and a first terminal of the capacitor Csc are coupled to the first input terminal A of the scan circuit 414. Each of a second terminal of the capacitor Csc, a second input terminal B of the scan circuit 414, and a first terminal of the capacitor C1 is coupled to the node N1. An anode of the diode Dg and a cathode of the diode Dc are coupled to the second terminal of the capacitor C1. A cathode of the diode Dg is coupled to a ground terminal 0, and an anode of the diode Dc is coupled to a node N2. A source of the transistor YscL and a first terminal of the capacitor C2 are coupled to the node N2, a drain of the transistor YscL is coupled to the second input terminal B of a scan circuit 414, and a second terminal of the capacitor C2 is coupled to the ground terminal 0. When the transistor YscL is turned on, the voltage (VscH-VscL) can be charged in the capacitor Csc.

A drain of the transistor Yg and a source of the transistor Ys of the sustain driver 412 are coupled to the node N1. A drain of the transistor Ys is coupled to a power source Vs for supplying a voltage Vs, and a source of the transistor Yg is coupled to the ground terminal 0. The sustain driver 412 applies a sustain discharge pulse having a voltage Vs to a plurality of Y electrodes through the second input terminal B of the scan circuit 414 during a sustain period of each subfield. That is, during the sustain period, in a state where the transistor Ypn is turned on, as two transistors (Ys, Yg) are alternately turned on, voltages of Vs and 0V can be alternately applied to the Y electrode through a transistor Scl of the scan circuit 414. The sustain driver 412 may further include an energy recovery circuit (not illustrated) for recovering and reusing reactive power, in addition to the transistors (Ys, Yg).

A drain of the transistor Yrr in the reset driver 411 is coupled to a power source Vset for supplying a Vset voltage, and a source of the transistor Yrr is coupled to the node N1. An anode of the diode Dset is coupled to the power source Vset, and a cathode of the diode Dset is coupled to the drain of the transistor Yrr. A drain of the transistor Yfr of the reset driver 411, is coupled to a drain of the transistor YscL. A source of the transistor Yfr is coupled to the node N2, and in a driving waveform of FIG. 2, because the voltage Vnf is higher than the voltage VscL, a Zener diode ZD is coupled between the drain of the transistor Yfr and the Y electrode of the panel capacitor Cp. Here, the voltage Vnf is assumed to be higher than the voltage VscL by the amount of the breakdown voltage of the Zener diode ZD. The Zener diode ZD may be coupled between the node N2 and the transistor Yfr. When the transistor Yrr is turned on, the transistor Yrr operates to have a minute current flow from a drain to a source so that a voltage of the Y electrode of the panel capacitor Cp slowly increases up to the voltage Vset, and when the transistor Yfr is turned on, the transistor Yfr operates to have a minute current flow from a drain to a source so that a voltage of the Y electrode of the panel capacitor Cp gradually decreases down to the voltage Vnf.

A drain of the transistor Ypn is coupled to a contact point between the sustain driver 412 and the reset driver 411, and a source of the transistor Ypn is coupled to the second input terminal B of the scan circuit 414. The transistor Ypn intercepts a current path that is formed through a body diode of the transistor Yg from the ground terminal 0 when the voltage VscL is applied to the Y electrode during an address period.

Hereinafter, an operation of the scan driver 413A in the scan electrode driving circuit 410A that is shown in FIG. 3 is described in detail with reference to FIGS. 4 and 5.

Figure 4:
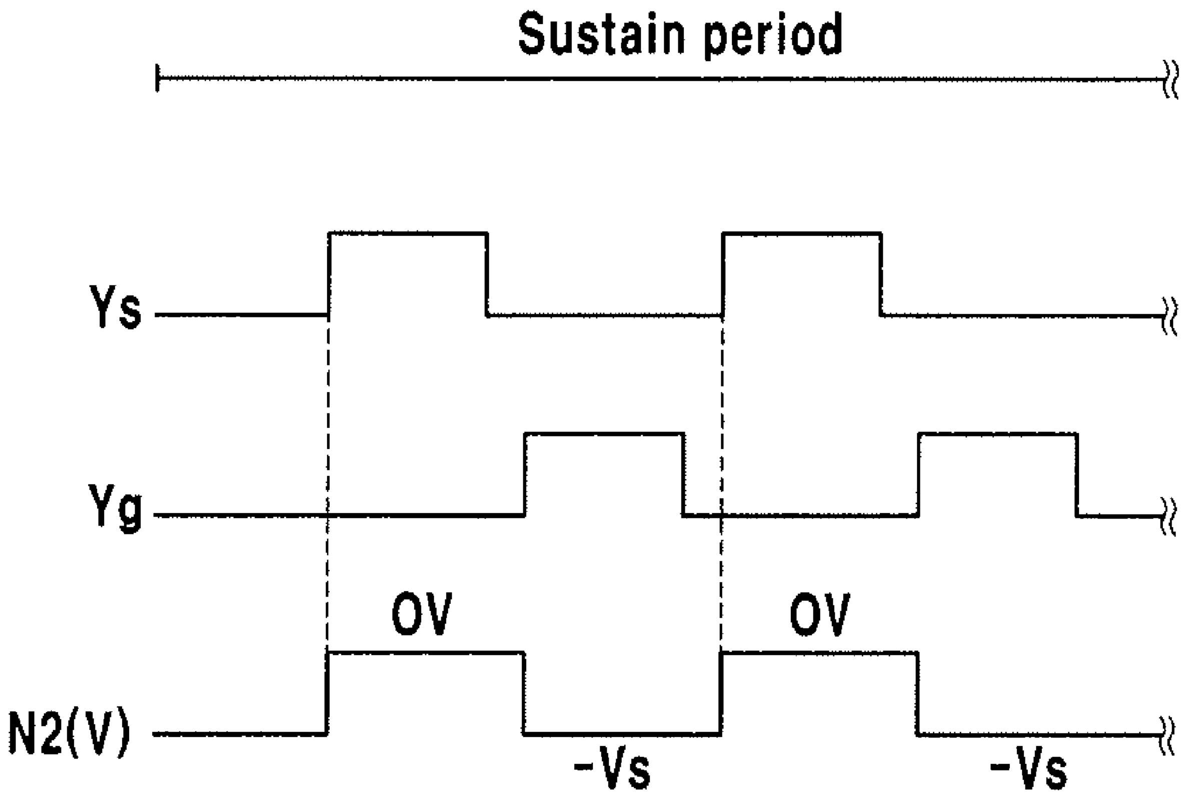
FIG. 4 is a timing diagram illustrating a voltage change of the node N2 that is shown in FIG. 3.

FIG. 4 is a timing diagram illustrating a voltage change of a node N2 that is shown in FIG. 3 according to gate signals on transistors Ys and Yg. FIG. 5 is a diagram illustrating current paths when transistors Ys and Yg in FIG. 3 are turned on and off.

Figure 5:
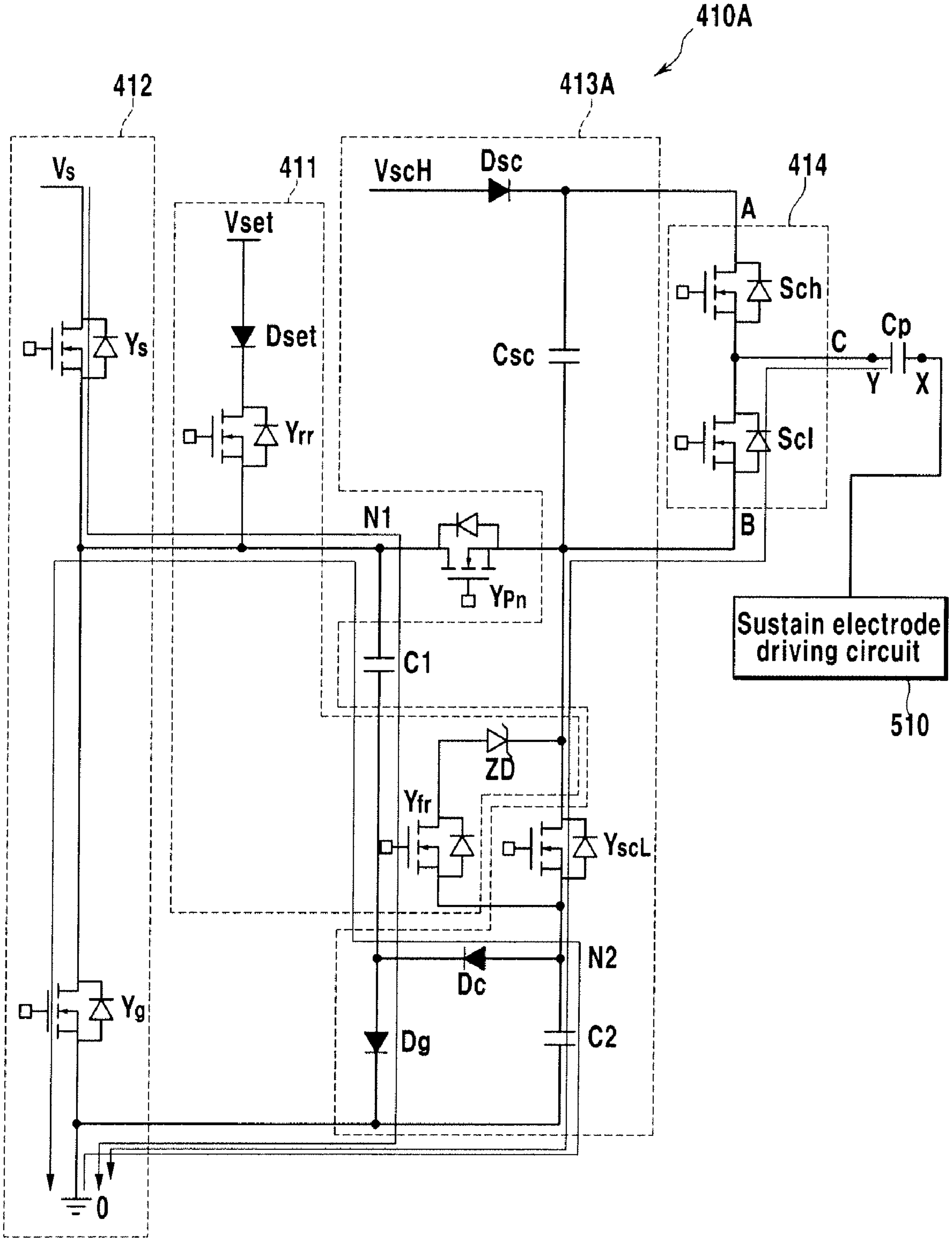
FIG. 5 is a diagram schematically illustrating current paths when transistors Ys and Yg in FIG. 4 are turned on and off.

As shown in FIG. 4, if the transistor Ys is turned on, the voltage Vs is applied to the Y electrode and as shown in FIG. 5, the voltage Vs is charged in the capacitor C1 as a path of the power source Vs, the transistor Ys, the capacitor C1, the diode Dg, and the ground terminal 0 is formed. At this time, a voltage of the second terminal of the capacitor C1, i.e., a voltage of the node N2 becomes 0V. Thereafter, the transistor Yg is turned on and the transistor Ys is turned off. Accordingly, as a voltage of the second terminal of the capacitor C1 becomes −Vs while 0V is applied to the Y electrode, and as shown in FIG. 5, a Vs voltage is charged in the capacitor C2 as a path of the ground terminal 0, the capacitor C2, the diode Dc, the capacitor C1, the transistor Yg, and the ground terminal 0 is formed. Accordingly, a voltage of the node N2 becomes −Vs. That is, in a sustain period, as the transistors (Ys, Yg) are alternately turned on, a voltage of the node N2 alternately becomes 0V and −Vs.

After a sustain period, because the node N2 sustains a voltage of −Vs, if the transistor YscL is turned on in an address period, a voltage of the node N2, i.e., −Vs is applied to the second input terminal B of the scan circuit 414. Accordingly, if the voltage VscL is equal to the voltage −Vs, when the transistor Scl of the scan circuit 414 is turned on during an address period, the voltage −Vs is applied to the Y electrode, and when the transistor Sch of the scan circuit 414 is turned on, the voltage VscH can be applied to the Y electrode.

Figure 6:
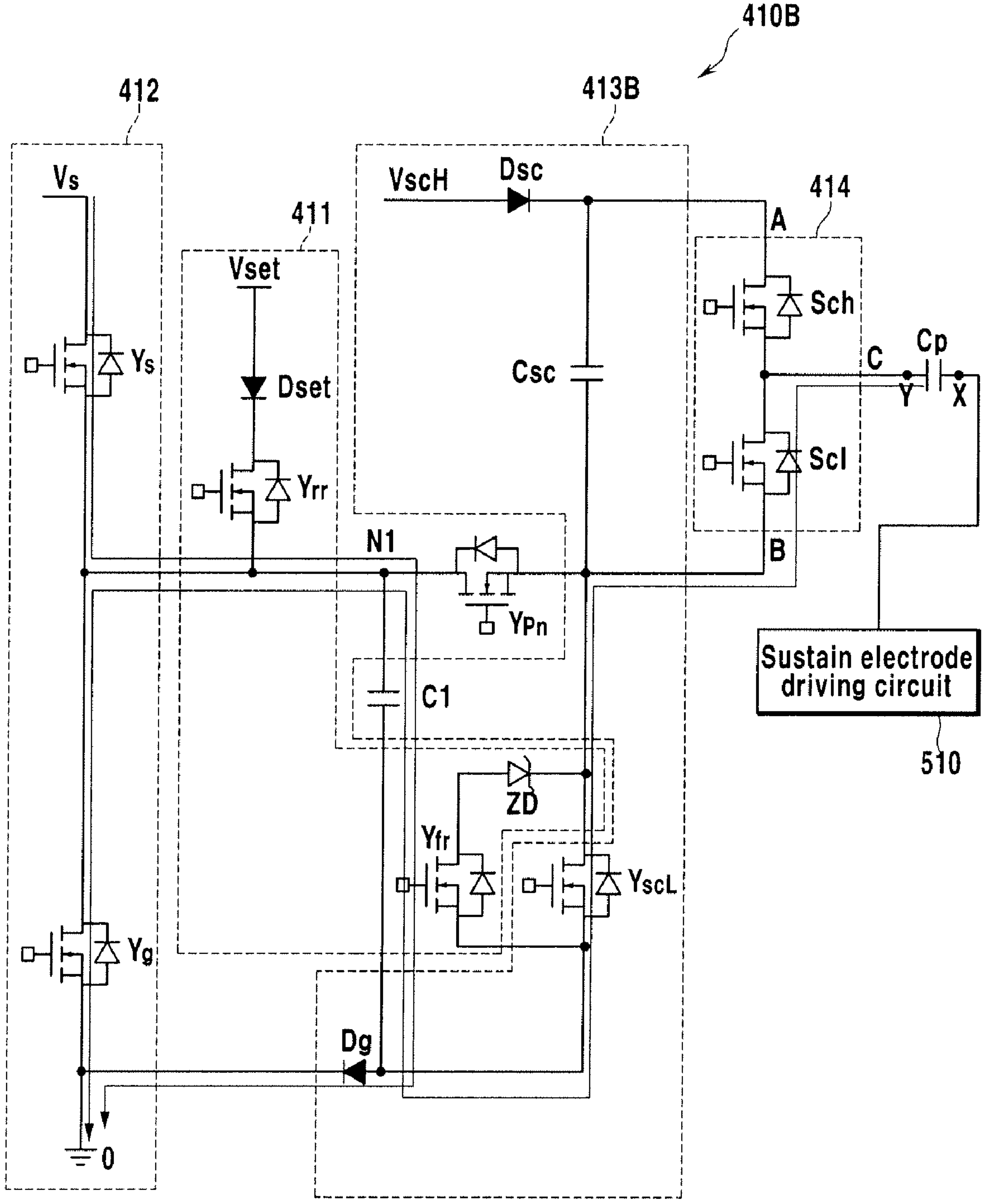
FIG. 6 is a diagram schematically illustrating a scan electrode driving circuit according to a second exemplary embodiment of the present invention.

FIG. 6 is a diagram schematically illustrating a scan electrode driving circuit according to a second exemplary embodiment of the present invention.

As shown in FIG. 6, the scan electrode driving circuit 410B according to the second exemplary embodiment of the present invention is equal to the scan electrode driving circuit 410A that is shown in FIG. 3 except that there are no capacitor C2 and diode Dc in the scan driver 413B.

That is, in a sustain period, whenever the transistor Ys is turned on, the Vs voltage is applied to the Y electrode, and as shown in FIG. 6, as a path of the power source Vs, the transistor Ys, the capacitor C1, the diode Dg, and the ground terminal 0 is formed, the Vs voltage is charged in the capacitor C1. Next, in an address period, the transistor Yg is turned on from an off state. Accordingly, as shown in FIG. 6, a voltage of the second terminal of the capacitor C1 becomes −Vs through a path of the capacitor C1, the transistor Yg, and the ground terminal 0.

In an address period, if the transistor YscL is turned on, a voltage of the second terminal of the capacitor C1, i.e., −Vs is applied to the second input terminal B of the scan circuit 414. Accordingly, if VscL is equal to −Vs, the transistor Scl of the scan circuit 414 is turned on during an address period, whereby −Vs is applied to the Y electrode.

The voltage VscL may not be equal to −Vs. Below, an exemplary embodiment of a case where VscL is higher than −Vs will be described in detail with reference to FIGS. 7 to 9.

Figure 7:
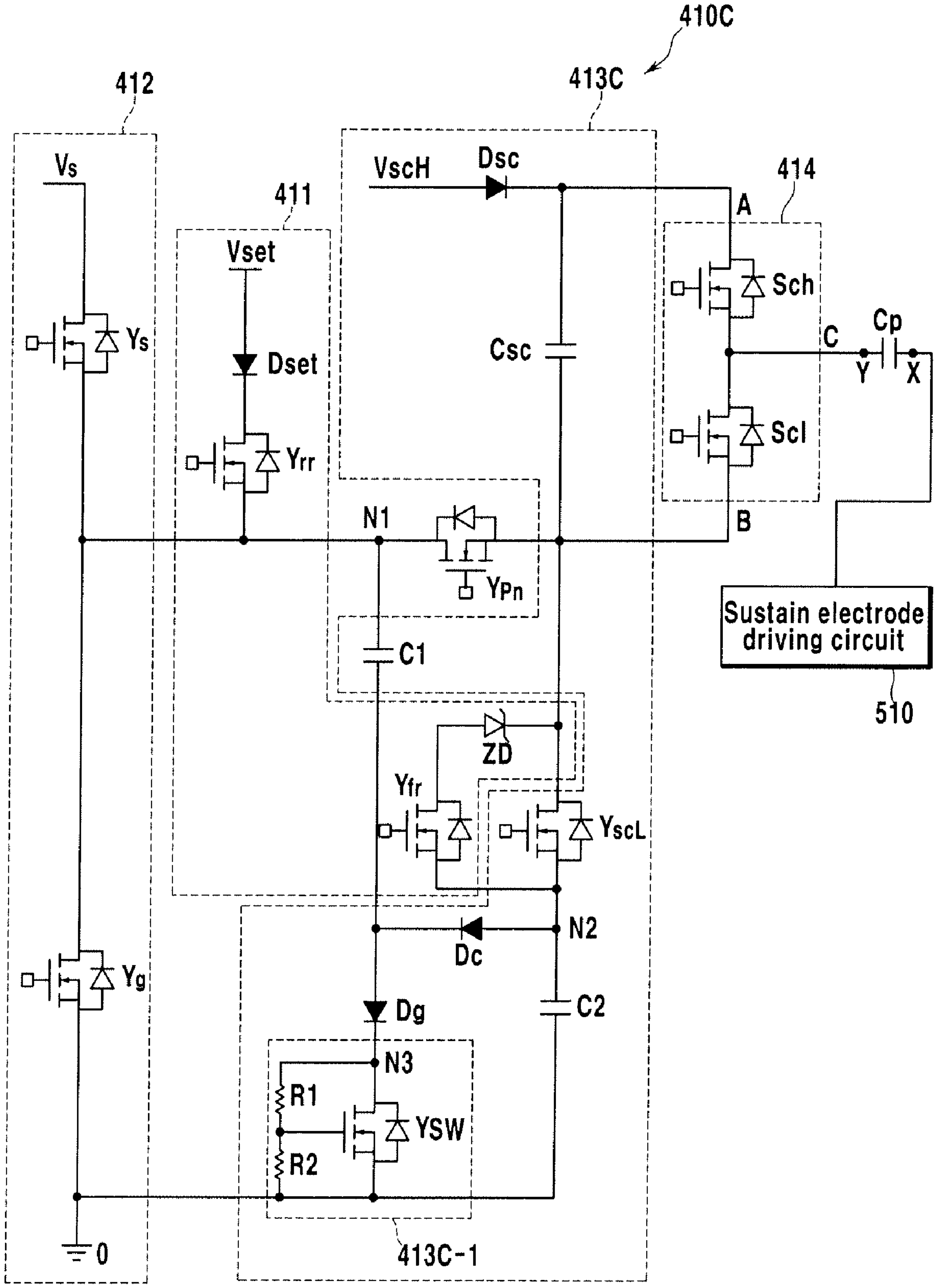
FIG. 7 is a diagram schematically illustrating a scan electrode driving circuit according to a third exemplary embodiment of the present invention.
Figure 8:
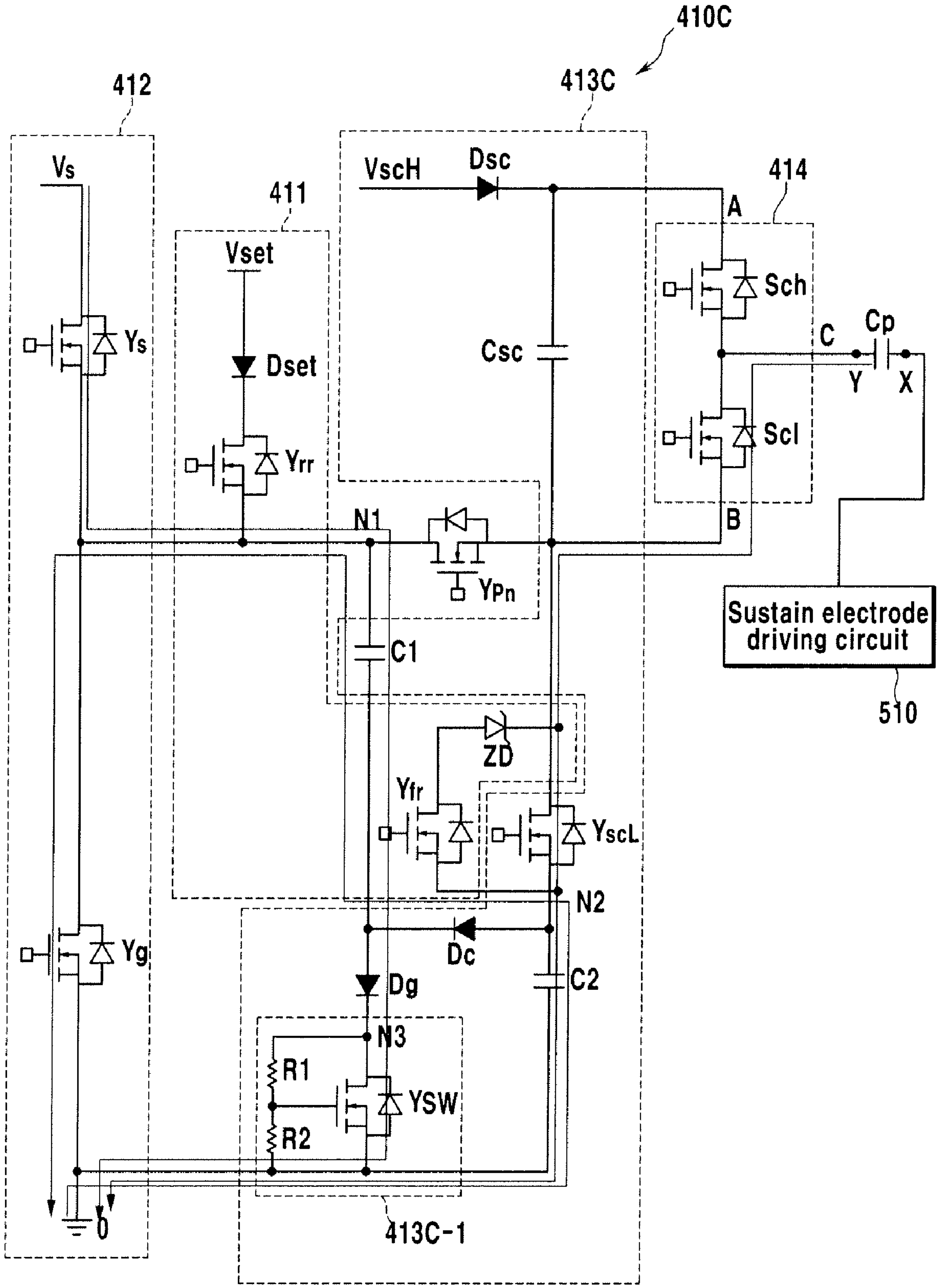
FIG. 8 is a diagram schematically illustrating current paths when a scan pulse is applied in an address period in the scan electrode driving circuit of FIG. 7.
Figure 9:
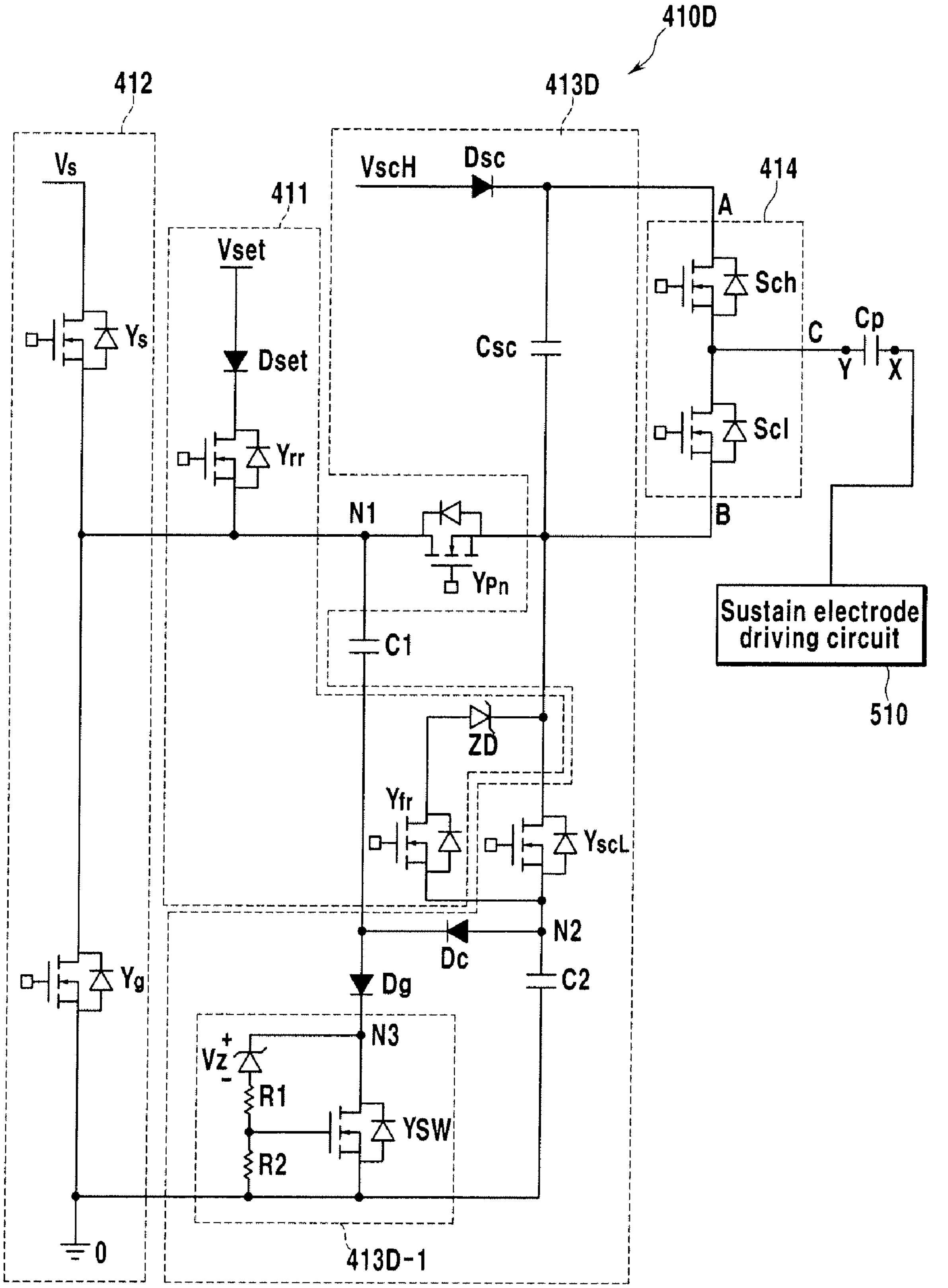
FIG. 9 is a diagram schematically illustrating a scan electrode driving circuit according to a fourth exemplary embodiment of the present invention.

FIG. 7 is a diagram schematically illustrating a scan electrode driving circuit according to a third exemplary embodiment of the present invention. FIG. 8 is a diagram illustrating current paths for applying a scan pulse during an address period with the scan electrode driving circuit of FIG. 7. FIG. 9 is a diagram schematically illustrating a scan electrode driving circuit according to a fourth exemplary embodiment of the present invention.

As shown in FIG. 7, the scan electrode driving circuit 410C according to the third exemplary embodiment of the present invention is the same as the scan driver 413A in the scan electrode driving circuit 410A according to the first exemplary embodiment of the present invention that is shown in FIG. 3, except that the scan driver 413C further includes a voltage multiplier 413C-1. Specifically, the voltage multiplier 413C-1 includes a transistor Ysw and resistors R1 and R2. A cathode of the diode Dg is coupled to a node N3, a drain of the transistor Ysw is coupled to the node N3, and a source of the transistor Ysw is coupled to the ground terminal 0. The resistors R1 and R2 are coupled in series between the drain and the source of the transistor Ysw, and a contact point of two resistors R1 and R2 is coupled to a gate of the transistor Ysw.

Unlike FIG. 7, the diode Dg may be coupled between the ground terminal and the voltage multiplier 413C-1. That is, the cathode of the diode Dg may be coupled to the ground terminal and the anode of the diode Dg may be coupled to the drain of the transistor Ysw and the resistor R2.

Referring again to FIG. 7, in the scan driver 413C of the scan electrode driving circuit 410C according to the third exemplary embodiment of the present invention, when the transistor Ys is turned on in a sustain period, if a voltage is not charged in the capacitor C1, a voltage of the node N3 also becomes a Vs voltage. A voltage that is divided by the two resistors R1 and R2 becomes a gate voltage of the transistor Ysw. Because the transistor Ysw is an n-channel transistor, the transistor Ysw is turned on by a positive gate-source voltage Vgs, and as shown in FIG. 8, the capacitor C1 is charged through a path of the power source Vs, the transistor Ys, the capacitor C1, the diode Dg, the transistor Ysw, and the ground terminal 0.

Next, as the capacitor C1 is charged, a voltage Vx of the node N3 decreases and thus if a gate-source voltage Vgs of the transistor Ysw becomes lower than a threshold voltage Vth of a transistor Ysw, as in Equation 1, the transistor Ysw is turned off. At this time, the voltage Vx of the node N3 is determined as in Equation 2, and the voltage (Vs−Vx) is charged in the capacitor C1.

$$Vgs = |Vx| \cdot \frac{R2}{R1 + R2} < Vth \quad \text{Equation 1}$$

$$Vx \approx -Vth\left(1 + \frac{R1}{R2}\right) \quad \text{Equation 2}$$

Next, in a sustain period, if the transistor Yg is turned on and the transistor Ys is turned off, as shown in FIG. 8, the voltage (Vs−Vx) is charged in the capacitor C2 through a path of the ground terminal 0, the capacitor C2, the diode Dc, the capacitor C1, the transistor Yg, and the ground terminal 0.

In an address period, if the transistor YscL is turned on, a voltage of the node N2, i.e., (−Vs+Vx) is applied to the second input terminal B of the scan circuit 414. Accordingly, the voltage (−Vs+Vx) can be used as the voltage VscL. At this time, if the resistor R1 is removed, the voltage Vx becomes the voltage −Vth, and thus the voltage (−Vs+Vth) can be used as the voltage VscL.

By using a Zener diode ZD, as in FIG. 9, a voltage higher than the voltage (−Vs+Vx) by the amount of the reverse breakdown voltage Vz may be used as the VscL voltage.

That is, as shown in FIG. 9, a scan driver 413D of the scan electrode driving circuit 410D according to a fourth exemplary embodiment of the present invention is equal to the scan driver 413C of the scan electrode driving circuit 410C according to the third exemplary embodiment of the present invention that is shown in FIG. 7 except that a Zener diode ZD is coupled between the node N3 and the resistor R1. Specifically, a cathode of the Zener diode ZD is coupled to the node N3, and an anode of the Zener diode ZD is coupled to the resistor R1. Accordingly, because a voltage Vx of the node N3 is higher by a voltage of Vz than that in the third exemplary embodiment, a voltage equal to (−Vs+Vx+Vz) may be used as the VscL voltage. At this time, if the resistor R1 is removed, the voltage (−Vs+Vth+Vz) can be used as the VscL voltage.

According to the first through fourth exemplary embodiments of the present invention, the voltage VscL can be sequentially supplied to the Y electrodes Y1-Yn in an address period without using a separate power source for supplying the VscL voltage.

The voltage multipliers (413C-1, 413D-1) may alternatively be applied to the driver circuit of FIG. 5. Further, when the VscL voltage is equal to −Vset voltage, the VscL voltage is higher by a Vx voltage than −Vset voltage, or the VscL voltage is higher by (Vth+Vz) voltage than −Vset voltage, a power source Vset can be used instead of a power source Vs. Even when the power source Vset is used, the power source Vset can be applied to driving circuits of FIGS. 3, 5, 7, and 9.

According to the present invention, because a voltage VscL can be generated without forming an additional power source for supplying VscL, the number of power sources can be reduced in a plasma display device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A plasma display device including a plurality of scan electrodes and a scan electrode driving circuit, the scan electrode driving circuit of the plasma display device comprising:

a plurality of scan electrodes;

a first transistor coupled between a first power source for supplying a first voltage and a first node;

a second transistor coupled between a second power source for supplying a second voltage that is lower than the first voltage and the first node;

a plurality of scan circuits respectively coupled to the plurality of scan electrodes, wherein the plurality of scan circuits are adapted to selectively apply a voltage of a first input terminal and a second input terminal of the scan circuits to a corresponding one of the scan electrodes;

a first capacitor comprising a first terminal coupled to the first node;

a first diode coupled between a second terminal of the first capacitor and the second power source, wherein the first diode is in a path for charging the first capacitor when the first transistor is turned on;

a third transistor coupled between the second input terminal of the plurality of scan circuits and the second terminal of the first capacitor;

a second capacitor coupled between the second terminal of the first capacitor and the second power source; and a second diode having an anode coupled to the third transistor, and a cathode coupled to the second terminal of the first capacitor.

2. The plasma display of claim 1, wherein the first and second transistors are alternately turned on during a sustain period.

3. The plasma display of claim 1 or claim 2, further comprising:

a fourth transistor having a first terminal coupled to a cathode of the first diode and a second terminal coupled to the second power source; and a first resistor coupled between the second terminal of the fourth transistor and a control terminal of the fourth transistor.

4. The plasma display of claim 3, further comprising:

a second resistor coupled between the first terminal of the fourth transistor and the control terminal of the fourth transistor.

5. The plasma display of claim 3, further comprising:

a Zener diode coupled between the first terminal of the fourth transistor and the control terminal of the fourth transistor.

6. The plasma display of claim 3, further comprising:

a series combination of a second resistor and a Zener diode, coupled between the first terminal of the fourth transistor and the control terminal of the fourth transistor.

7. The plasma display of claim 1 or claim 2, further comprising:

a fourth transistor coupled between the first node and the third transistor.

8. The plasma display of claim 1 or claim 2, wherein the second voltage comprises a ground voltage.

9. The plasma display of claim 1, wherein during a reset period, as the first transistor is turned on, a voltage of the plurality of scan electrodes gradually increases up to the first voltage.

10. The plasma display of claim 1 or claim 2, wherein the plurality of scan circuits further comprise:

a fourth transistor coupled between the first input terminal and the scan electrode; and a fifth transistor coupled between the second input terminal and the scan electrode, wherein the fifth transistor is adapted to be selectively turned on in an address period.

11. A scan electrode driving method for a plasma display device including a plurality of scan electrodes and a scan electrode driving circuit, the scan electrode driving method comprising:

applying a first voltage to a first node to charge a first capacitor having a first terminal connected to the first node with a second voltage applying a third voltage to the first node to charge a second capacitor having a first terminal coupled to a second node with a fourth voltage, wherein the second node has a voltage of a second terminal of the first capacitor; and selectively applying a voltage of the second node to the plurality of scan electrodes during an address period.

12. The scan electrodes driving method for a plasma display device according to claim 11, further comprising:

alternately applying the first voltage and the third voltage to the plurality of scan electrodes during a sustain period.

13. The scan electrode driving for a plasma display device according to claim 11, further comprising:

gradually increasing a voltage of the plurality of scan electrodes up to the first voltage during a reset period.

14. The scan electrode driving method for a plasma display device according to claim 12 or claim 13, further comprising:

applying the third voltage to a second terminal of the second capacitor for charging the second capacitor with the fourth voltage during the address period.

15. The scan electrode driving method for a plasma display device according to claim 14, wherein the charging of the first capacitor with the second voltage stops charging the first capacitor when a voltage of the second terminal of the first capacitor is a fifth voltage, which is higher than the third voltage.

16. The scan electrode driving method for a plasma display device according to claim 14, wherein the third voltage is lower than the first voltage.

* * * * *

UNITED STATES PATENT AND TRADEMARK OFFICE

CERTIFICATE OF CORRECTION

PATENT NO. : 7,616,196 B2
APPLICATION NO. : 11/966789
DATED : November 10, 2009
INVENTOR(S) : Joo-Yul Lee It is certified that error appears in the above-identified patent and that said Letters Patent is hereby corrected as shown below:

| | |
|---|---|
| Column 9, Claim 2, line 65 | After "display" Insert -- device -- |
| Column 10, Claim 3, line 1 | After "display" Insert -- device -- |
| | Delete "or claim **2**" |
| Column 10, Claim 4, line 9 | After "display" Insert -- device -- |
| Column 10, Claim 5, line 13 | After "display" Insert -- device -- |
| Column 10, Claim 6, line 17 | After "display" Insert -- device -- |
| Column 10, Claim 7, line 21 | After "display" Insert -- device -- |
| | Delete "or claim **2**" |
| Column 10, Claim 8, line 25 | After "display" Insert -- device -- |
| | Delete "or claim **2**" |
| Column 10, Claim 9, line 27 | After "display" Insert -- device -- |
| Column 10, Claim 10, line 31 | After "display" Insert -- device -- |
| | Delete "or claim **2**" |
| Column 10, Claim 11, line 45 | After "voltage" Insert -- ; -- |
| Column 10, Claim 12, line 52 | Delete "electrodes" Insert -- electrode -- |
| Column 10, Claim 13, line 57 | After "driving" Insert -- method -- |
| Column 11, Claim 14, line 2 | Delete "claim **12** or" |

Signed and Sealed this
Twelfth Day of April, 2011

David J. Kappos
*Director of the United States Patent and Trademark Office*